United States Patent
Boldi et al.

(10) Patent No.: US 10,334,478 B2
(45) Date of Patent: Jun. 25, 2019

(54) METHOD FOR REDUCING FRONTHAUL LOAD IN CENTRALIZED RADIO ACCESS NETWORKS (C-RAN)

(71) Applicant: Telecom Italia S.p.A., Milan (IT)

(72) Inventors: Mauro Boldi, Turin (IT); Paolo Gianola, Turin (IT); Bruno Melis, Turin (IT)

(73) Assignee: Telecom Italia S.p.A., Milan (IT)

( * ) Notice: Subject to any disclaimer, the term of this patent is extended or adjusted under 35 U.S.C. 154(b) by 173 days.

(21) Appl. No.: 15/321,647

(22) PCT Filed: Jun. 23, 2014

(86) PCT No.: PCT/EP2014/063137
§ 371 (c)(1),
(2) Date: Dec. 22, 2016

(87) PCT Pub. No.: WO2015/197104
PCT Pub. Date: Dec. 30, 2015

(65) Prior Publication Data
US 2017/0164236 A1 Jun. 8, 2017

(51) Int. Cl.
*H04W 28/08* (2009.01)
*H04B 10/2575* (2013.01)
(Continued)

(52) U.S. Cl.
CPC ...... *H04W 28/08* (2013.01); *H04B 10/25753* (2013.01); *H04B 10/25758* (2013.01);
(Continued)

(58) Field of Classification Search
CPC ........... H03M 7/3059; H04B 10/25753; H04B 10/25758; H04L 27/2601; H04L 27/2602; H04W 88/085
(Continued)

(56) References Cited

U.S. PATENT DOCUMENTS 9,628,139 B2 * 4/2017 Agata .................. H04W 16/26
9,900,045 B2 * 2/2018 Agata .................. H04W 16/26
(Continued)

FOREIGN PATENT DOCUMENTS

EP           2582109 A2    4/2013
WO     2010/075864 A1    7/2010
(Continued)

OTHER PUBLICATIONS

Sep. 11, 2014—(WO) ISR and Written Opinion—App PCT/EP2014/063137.
(Continued)

*Primary Examiner* — Robert J Lopata
(74) *Attorney, Agent, or Firm* — Banner & Witcoff, Ltd.

(57) ABSTRACT

A method is proposed of arranging, in a mobile communication network, transmission of data between user equipment and at least one base station including a central unit and at least one remote unit associated therewith. The method includes at a transmitting side including the remote unit or the central unit, quantizing the data according to a quantization bit number, and transmitting, over a fronthaul link between the transmitting side and a receiving side including the central unit or the remote unit, respectively, the quantized data to the receiving side. The method further includes, at the central unit: determining the quantization bit number, wherein the determining including varying in time the quantization bit number according to network information available at the central unit, and communicating to the at least one remote unit the determined quantization bit number.

18 Claims, 3 Drawing Sheets

(51) Int. Cl.
*H04W 88/08* (2009.01)
*H04L 27/26* (2006.01)
*H03M 7/30* (2006.01)

(52) U.S. Cl.
CPC ....... *H04L 27/2602* (2013.01); *H04W 88/085* (2013.01); *H03M 7/3059* (2013.01); *H04L 27/2601* (2013.01)

(58) Field of Classification Search
USPC .......................................................... 370/252
See application file for complete search history.

(56) References Cited

U.S. PATENT DOCUMENTS

| | | | | |
|---|---|---|---|---|
| 2009/0219865 A1* | 9/2009 | Salzer | .................. | H04L 1/0026 370/329 |
| 2010/0124930 A1* | 5/2010 | Andrews | .............. | H04W 16/10 455/436 |
| 2011/0013714 A1* | 1/2011 | Tamaki | ............. | H04L 25/03828 375/285 |
| 2013/0083768 A1* | 4/2013 | Liu | ..................... | H04L 27/2636 370/330 |
| 2014/0211687 A1* | 7/2014 | Yu | ............................ | H04B 7/00 370/315 |
| 2014/0219162 A1* | 8/2014 | Eyuboglu | ............. | H04W 16/26 370/315 |
| 2014/0219255 A1* | 8/2014 | Eyuboglu | ............. | H04W 72/12 370/336 |
| 2014/0219267 A1* | 8/2014 | Eyuboglu | ........... | H04W 56/001 370/350 |
| 2014/0341048 A1* | 11/2014 | Sajadieh | ............... | H04L 5/0085 370/252 |
| 2015/0117470 A1* | 4/2015 | Ryan | ...................... | H04L 69/04 370/477 |
| 2015/0146565 A1* | 5/2015 | Yu | ......................... | H04B 7/024 370/253 |
| 2015/0229380 A1* | 8/2015 | Bartelt | ................ | H04B 7/0639 375/224 |
| 2015/0229397 A1* | 8/2015 | Shibata | ........... | H04B 10/25754 398/115 |
| 2015/0295652 A1* | 10/2015 | Luo | ......................... | H03M 7/30 398/182 |
| 2015/0358030 A1* | 12/2015 | Xia | ..................... | H03M 7/3082 341/87 |
| 2016/0037550 A1* | 2/2016 | Barabell | .............. | H04B 17/318 455/450 |
| 2016/0192382 A1* | 6/2016 | Soldati | ............. | H04W 72/1231 370/329 |
| 2017/0238361 A1* | 8/2017 | Pawar | .................... | H03M 7/40 455/561 |

FOREIGN PATENT DOCUMENTS

| | | |
|---|---|---|
| WO | 2010/075865 A1 | 7/2010 |
| WO | 2013/113351 A1 | 8/2013 |
| WO | 2014/006499 A1 | 1/2014 |
| WO | 2014/076004 A2 | 5/2014 |

OTHER PUBLICATIONS

Lorca J et al: "Lossless compression technique for the fronthaul of LTE/LTE-advanced cloud-RAN architectures", 2013 IEEE 14th International Symposium on a World of Wireless, Mobile and Multimedia Networks (WOWMOM), IEEE, Jun. 4, 2013 (Jun. 4, 2013), pp. 1-9, XP032507404, DOI: 101109/WOWMOM.2013. 6583374 ISBN: 978-1-4673-5827-9 [retrieved on Aug. 20, 2013].
Nanba Shinobu et al: "A new IQ data compression scheme for front-haul link in Centralized RAN", 2013 IEEE 24th International Symposium on Personal, Indoor and Mobile Radio Communications (PIMRC Workshops), IEEE, Sep. 8, 2013 (Sep. 8, 2013), pp. 210-214, XP032544963, DOI: 10.1109/PIMRCW.2013.6707866 [retrieved on Jan. 8, 2014].
Dragan Samardzija et al: "Compressed Transport of Baseband Signals in Radio Access Networks", IEEE Transactions on Wireless Communications, IEEE Service Center, Piscataway, NJ, US, vol. 11, No. 9, Sep. 1, 2012 (Sep. 1, 2012), pp. 3216-3225, XP011463428, ISSN: 1536-1276, DOI: 10.1109/TWC.2012.062012.111359.

\* cited by examiner

METHOD FOR REDUCING FRONTHAUL LOAD IN CENTRALIZED RADIO ACCESS NETWORKS (C-RAN)

BACKGROUND OF THE INVENTION

Field of the Invention

The present invention generally relates to mobile communication networks—hereinafter, mobile networks. More specifically, the present invention relates to mobile networks based on a "Centralized Radio Access Network" (CRAN) architecture—shortly, CRAN systems.

The work leading to the present invention has received funding from the European Union's Seventh Framework Program FP7/2007-2013 under grant agreement n. 317941—project iJOIN.

Overview of the Related Art

A CRAN system typically comprises one or more central units each one connected to a plurality of remote units (preferably by means of respective optical fiber links).

According to a conventional CRAN system architecture, in the downlink, the central unit receives data to be transmitted to user equipment of the mobile network, and provides a digital base-band signal. The digital base-band signal is then converted from electrical to optical, and transmitted to the remote units over optical fiber links. Each remote unit receives the optical base-band signal, which is then converted from optical to electrical, filtered, converted from digital to analog, up-converted from base-band to radio-frequency and amplified, before being radiated by antennas to the user equipment.

In radio access technologies based on OFDMA ("Orthogonal Frequency Division Multiple Access"), such as WiMAX ("Worldwide Interoperability for Microwave Access"), and LTE ("Long Term Evolution")/LTE-A ("LTE-Advanced"), the digital base-band signal is a composite digital base-band signal, namely it is composed of signals for different user equipment (or user signals) that are superimposed in the time domain.

Conventional CRAN systems thus provide for transmission of one (optical) composite base-band signal (over the fiber links) for each (transmitting) antenna of each remote unit when downlink is considered, or of one (optical) composite base-band signal (over the fiber links) for each (receiving) antenna of each remote unit when uplink is considered, in the time-domain (e.g., according to "Open Base Station Architecture Initiative" (OBSAI) or "Common Public Radio Interface" (CPRI) standards. As a result of that, as the number of remote units connected to a given central unit increases, the available transmission capacity on the fiber links may rapidly become a bottleneck. Additionally, available transmission capacity on the fiber links may also be saturated by a relatively low number of signals, especially when taking into account the growing data rate that the new radio access technologies impose—and that is expected to grow further with the forthcoming techniques such as "Multiple Input Multiple Output" (MIMO) and carrier aggregation techniques.

Some prior-art solutions have been addressed to such issues.

Signal processing algorithms have been proposed (such as "adaptive beamforming" and "network coordination" algorithms) that operate on each user signal separately.

WO2010/075865, "A Method for adaptive distributed Mobile Communications, corresponding system and computer program product", discloses a method of arranging exchange of signals between user terminals in a cellular communication system and at least one base station including a central unit and a plurality of remote units. The method includes exchanging signals with at least one user terminal simultaneously via at least two remote units by applying at the at least two remote units separate distributing weighting functions to the signals exchanged with the at least one user terminal.

WO2010/075864, "A Method for distributed Mobile Communications, corresponding system and computer program product", discloses a method of arranging exchange of signals between user terminals in a cellular communication system and at least one base station. The base station includes a central unit and a plurality of remote units. The signals are exchanged between the central unit and the remote units as aggregated signals for plural user equipment. The signals are processed at the remote units as distinct signals each associated to a respective one of the plural user equipment. Specifically, WO2010/075864 illustrates a method to reduce data over radio over fiber links (usually referred to as "fronthaul", in order to distinguish these links from "backhaul" links, which instead connect the central unit to the mobile transport network) based on frequency domain transmission. This is achieved by arranging IFFT/FFT modules in the remote units, and transmitting signals in the frequency-domain.

SUMMARY OF INVENTION

The Applicant has found that the above-cited solutions are not fully satisfactory for modern technological requirements.

Specifically, the Applicant has found that conventional CRAN systems wherein signal processing operations are delegated to the central units are affected by flexibility issues, as any algorithm changes may involve software and/or hardware modifications in the central unit, as well as scalability issues, as involving a limitation on a maximum number of remote units that can be connected to a given central unit.

These issues are exacerbated in CRAN systems relying on signal processing algorithms operating on each user signal separately (such as "adaptive beamforming" and "network coordination" algorithms), as application of such algorithms requires that signal processing operations are performed at a central unit side (wherein the user signals are still separately available), thus further burdening the central unit. The applicant thus believes that for effective application of such algorithms, data rate of the signals transmitted on the fiber links should be reduced.

The Applicant has found that, although frequency-domain transmission approach disclosed in WO2010/075864 and WO2010/075865 allows a relevant reduction of the data rate with respect to traditional time-domain based methods, data rate of the signals transmitted on the fiber links should be further reduced in order to meet modern requirements of increase of the maximum number of remote units that can be connected to a given central unit.

In view of the above, the Applicant has devised a solution aimed at overcoming these, as well as other, drawbacks. Specifically, the Applicant has devised a system and a method providing transmission, over the fronthaul link, of quantized data being quantized by a quantization bit number varying in time according to network information available at the central unit.

One or more aspects of the solution according to embodiments of the invention are set out in the independent claims, with advantageous features of the same solution that are set forth in the dependent claims (whose wording is enclosed herein verbatim by reference).

More particularly, the solution according to embodiments of the present invention relates to a method of arranging, in a mobile communication network, transmission of data between user equipment and at least one base station comprising a central unit and at least one remote unit associated therewith. The method comprises:

at a transmitting side comprising the remote unit or the central unit,
quantizing the data according to a quantization bit number, and
transmitting, over a fronthaul link between the transmitting side and a receiving side comprising the central unit or the remote unit, respectively, the quantized data to the receiving side.

The method further comprises, at the central unit:
determining the quantization bit number, wherein the determining comprises varying in time the quantization bits number according to network information available at the central unit, and
communicating to the at least one remote unit the determined quantization bit number.

According to an embodiment of the present invention, the network information comprises data traffic that the transmitting side has to transmit to the receiving side, and the quantization bit number is determined so as to distribute a data load capacity of the fronthaul link between each one of the at least one remote unit according to the data traffic.

According to an embodiment of the present invention, the network information comprises user profile and/or service type.

According to an embodiment of the present invention, the network information comprises an indication of a spatial distribution of a data traffic that the transmitting side has to transmit to the receiving side, the method further comprising determining the spatial distribution of the data traffic according to at least one parameter measured at central unit.

According to an embodiment of the present invention, the parameter comprises at least one between:
Average number of "Hybrid Automatic Repeat Request" transmissions;
Average number of "Radio Link Control" transmissions;
Average "Block Error Rate" after a first "Hybrid Automatic Repeat Request" transmission;
"Signal to interference plus Noise Ratio".

According to an embodiment of the present invention, the transmitting the quantized data to the receiving side comprises transmitting the quantized data in the frequency-domain.

According to an embodiment of the present invention, the transmitting side comprises the at least one remote unit and the receiving side comprises the central unit.

Another aspect of the solution according to embodiments of the present invention relates to a system for exchanging data with user equipment in a mobile communication network. The system comprises a central unit adapted to be associated with at least one remote unit, and configured to:
determine a quantization bit number according to network information available at the central unit, and
communicate the determined quantization bit number to the at least one remote unit in order to allow the at least one remote unit to quantize the data according to the quantization bits number and to transmit, over a fronthaul link between the central unit and the at least one remote unit, the quantized data to the central unit.

According to an embodiment of the present invention, the system further comprises the at least one remote unit.

According to an embodiment of the present invention, the at least one remote unit is connected to the central unit by means of optical fiber links.

According to an embodiment of the present invention, the at least one remote unit is connected to the central unit by means of wireless communication links.

According to an embodiment of the present invention, the network information comprises data traffic that the at least one remote unit has to transmit to the associated central unit, and the quantization bit number is determined so as to distribute a data load capacity of the fronthaul link between each one of the at least one remote unit according to the data traffic.

According to an embodiment of the present invention, the network information comprises user profile and/or service type.

According to an embodiment of the present invention, the network information comprises an indication of a spatial distribution of a data traffic that the at least one remote unit has to transmit to the associated central unit, the central unit being further configured to determine the spatial distribution of the data traffic according to at least one parameter measured at central unit between:
Average number of "Hybrid Automatic Repeat Request" transmissions;
Average number of "Radio Link Control" transmissions;
Average "Block Error Rate" after a first "Hybrid Automatic Repeat Request" transmission;
"Signal to interference plus Noise Ratio".

A further aspect of the solution according to embodiments of the present invention relates to a computer program product, loadable in the memory of at least one computer and including software code portions for performing the method of above when the computer program product is run on a computer.

BRIEF DESCRIPTION OF THE ANNEXED DRAWINGS

These and other features and advantages of the present invention will be made apparent by the following description of some exemplary and non limitative embodiments thereof. For its better intelligibility, the following description should be read making reference to the attached drawings, wherein.

DETAILED DESCRIPTION OF PREFERRED EMBODIMENTS OF THE INVENTION

Figure 1:
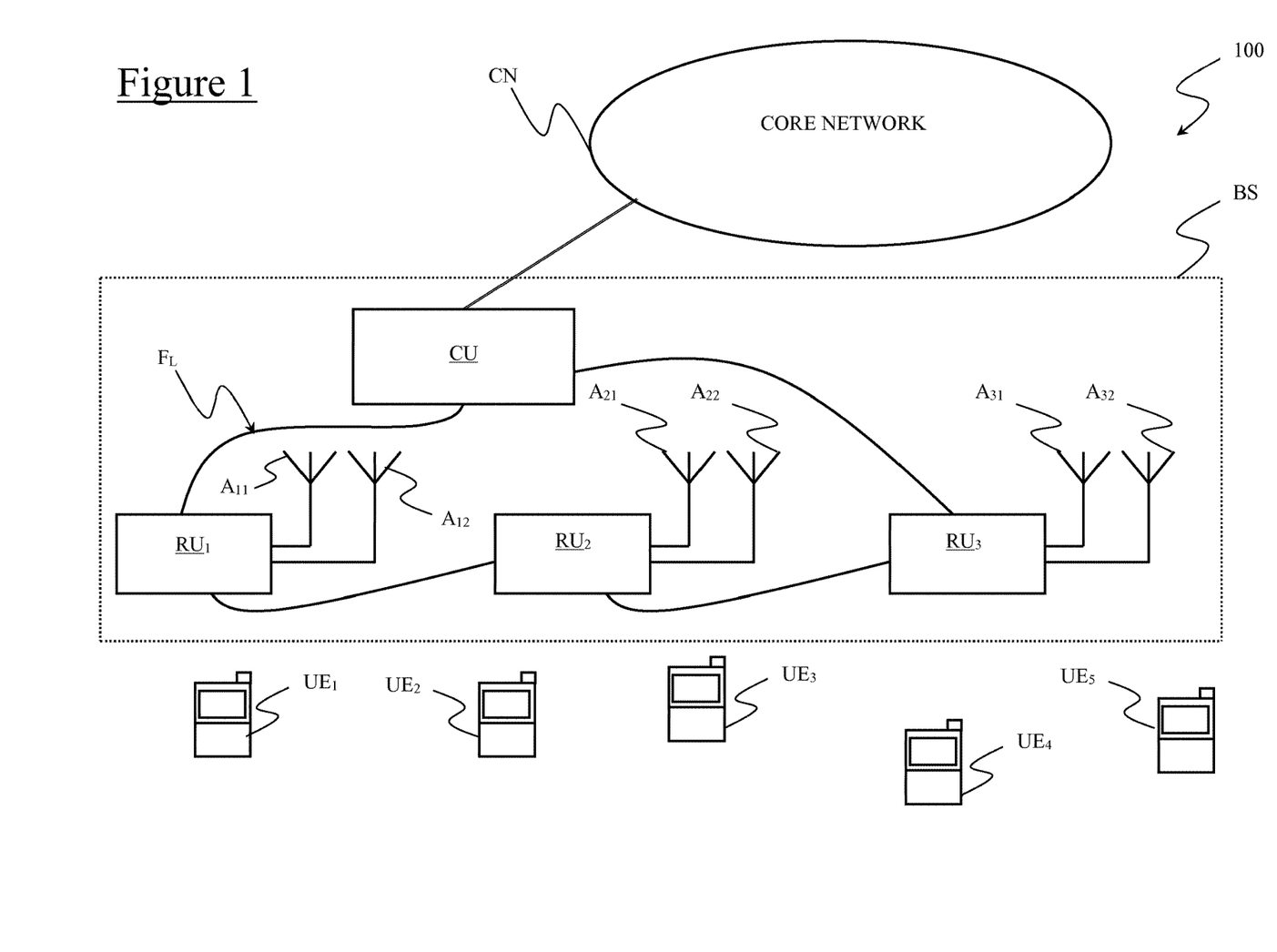
FIG. 1 schematically shows a mobile communication network wherein the present invention may be applied, and FIGS. 2A-2B schematically show portions of a mobile communication network according to respective embodiments of the present invention.

With reference to the drawings, FIG. 1 schematically show a mobile communication network (hereinafter, mobile network) 100 wherein the present invention may be applied.

The mobile network 100 allows data to be transmitted between user equipment $UE_i$ (i=1, 2, . . . , I), such as the user equipment $UE_1$-$UE_5$ (I=5), and one or more base stations, such as the base station BS.

The mobile network 100 is for example compliant with the 3GPP LTE/LTE-Advanced or WiMAX standards. However, the principles of the present invention generally apply to any mobile network based on an OFDM ("Orthogonal Frequency Division Multiplexing") technique, and are particularly advantageous when applied to mobile networks further based on a MIMO ("Multiple Input Multiple Output") or SC-FDMA ("Single Carrier Frequency Division Multiple Access") techniques.

According to OFDM technique, data to be transmitted (including both information data and control data) are split into data sequences, the data sequences are modulated by separate and reciprocally orthogonal sub-carriers and multiplexed into a stream of data including OFDM symbols, or OFDM symbols stream, for transmission. According to MIMO technique, multiple OFDM symbols streams are transmitted/received via multiple transmitting/receiving antennas, which improves communication performance without additional bandwidth or increased transmission power.

As known, OFDM technique is based on radio resources allocation in time/frequency domain. Considering for example the 3GPP LTE/LTE-Advanced standard, in time domain radio resources are distributed every "Transmission Time Interval" (TTI), each one lasting 1 ms (sub-frame) and comprising two time slots of 0.5 ms, whereas in frequency domain the whole bandwidth is divided into a plurality of 180-kHz sub-channels (each one corresponding to 12 adjacent and equally spaced sub-carriers, each sub-carrier being also referred to as resource element). A radio resource comprising a number of OFDM symbols (e.g., seven) spanning over one time slot in time domain and twelve adjacent sub-carriers in frequency domain is referred to as "Physical Resource Block" (PRB), and corresponds to the smallest radio resource that can be allocated to the i-th user equipment $UE_i$ for transmission.

According to the preferred, not limiting, illustrated scenario, the mobile network 100 is based on a "Centralized Radio Access Network" (hereinafter, CRAN) architecture, wherein each base station BS (or at least one of the base stations of the mobile network 100) comprises a central unit, such as the central unit CU, and one or more remote units $RU_j$ associated therewith (e.g., coupled or connected thereto) j=1, 2, ..., J, with J=3 in the example at issue. As illustrated, the central unit CU is preferably connected, on one side, to the remote units $RU_j$, e.g. by means of a (e.g., ring) optical fiber link $F_L$ (also referred to as fronthaul link), and, on the other side, to a core network CN (e.g., by means of a proper wireless or wired link also referred to as backhaul link). Each remote unit $RU_j$ comprises a number K of transmitting/receiving antenna $A_{j,k}$ (k=1, ..., K, with K=2 in the example at issue) for transmitting data from the central unit CU to plural user equipment $UE_i$ (and, hence, to plural remote units $RU_j$), or downlink transmission, and for transmitting data from plural user equipment $UE_i$ (and, hence, from plural remote units $RU_j$) to the central unit CU, or uplink transmission.

In the following description reference will be made to uplink transmission only, which the present invention is mainly, but not strictly, intended to.

Moreover, in the following, in order to discuss a practical scenario, reference will be exemplarily made to a CRAN architecture wherein base-band functionalities are distributed between the central unit CU and the remote units $RU_j$. Such a CRAN architecture, thoroughly discussed in WO2010/075864, is now well-known in the art, thus only relevant aspects thereof strictly necessary to the understanding of the present invention will be introduced and discussed hereinafter (with some other aspects that, instead, will be intentionally omitted for the sake of conciseness).

Figure 2A:
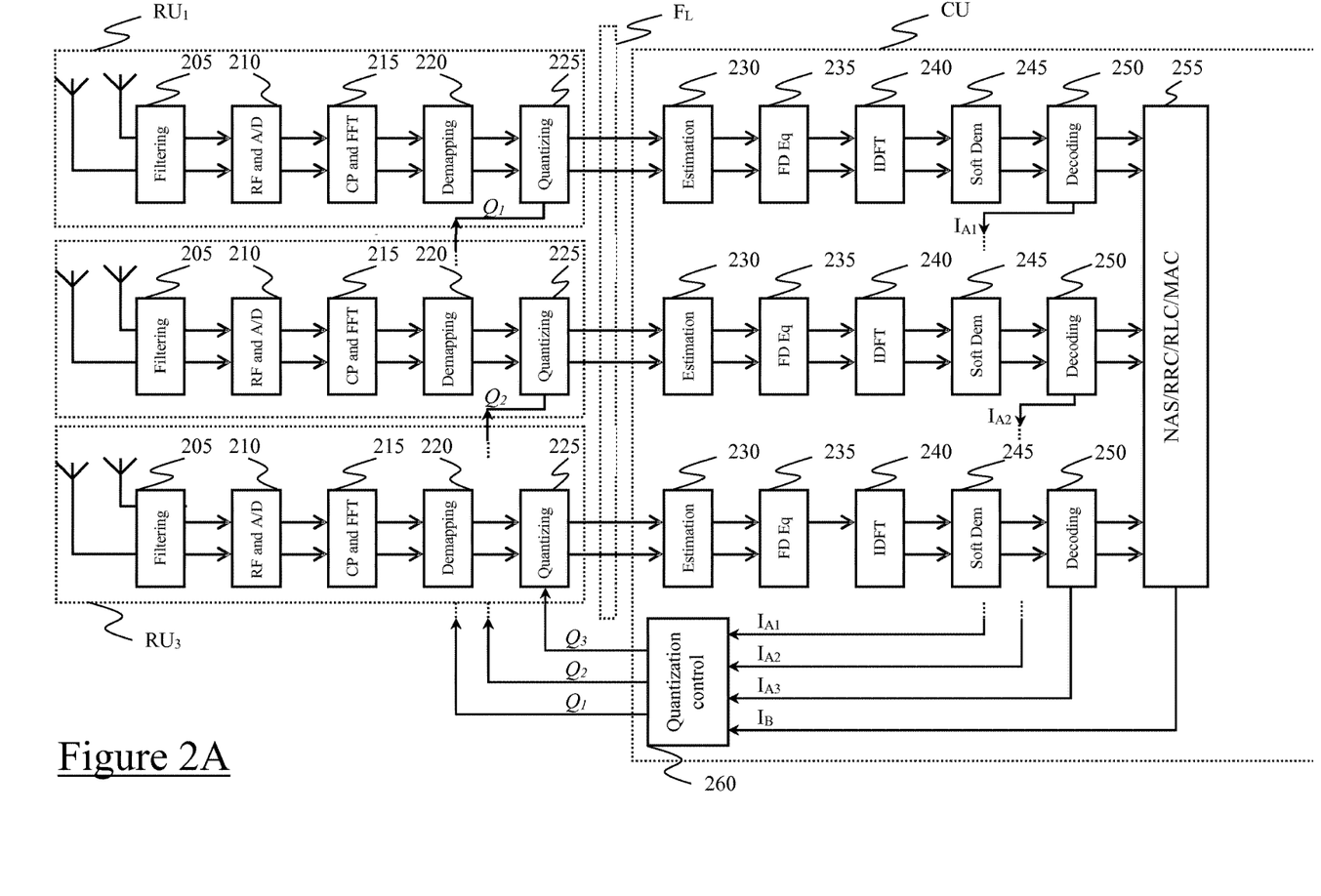

Specifically, with reference now to FIG. 2A, schematically showing some relevant modules of central CU and remote $RU_j$ (e.g., $RU_1$-$RU_3$) units according to a first embodiment of the present invention, channel estimation (module 230), frequency-domain equalization (module 235), "Inverse Discrete Fourier Transformation" (IDFT) precoding (module 240), soft-demodulation (i.e., symbol-to-bit demapping) (module 245), channel decoding (module 250) and higher layer protocols functionalities such as "Non Access Stratum" (NAS), "Radio Resource Control" (RRC), "Radio Link Control" (RLC) and "Medium Access Control" (MAC) layers (module 255) are performed in the central unit CU, whereas filtering (module 205), radio-frequency processing and analog-to-digital conversion (module 210), "Cyclic Prefix" (CP) removal and "Fast Fourier Transformation" (FFT) (module 215), resource element demapping (module 220), and quantization (module 225) are performed in each remote unit $RU_j$—however, embodiments wherein the demapping module 220 is provided in the central unit CU are not excluded.

As should be understood, the term "module" is herein intended to contemplate either hardware or software implementation. In the case of software implementation, each module is thus intended as a corresponding operative step, e.g. implemented by proper code means included in a computer program and performed when the program is run on a computer.

After quantization by a proper quantization bits number, the corresponding (OFDM) signal (or quantized signal) comprising, at each remote unit $RU_j$ side, the (OFDM) signals (separated in the frequency-domain) from each user equipment $UE_i$ belonging/pertaining to that remote unit $RU_j$, is transmitted, after electrical-to-optical conversion (not shown), over the optical fiber link $F_L$. Thanks to frequency-domain transmission over fronthaul link (i.e., the optical fiber link $F_L$ in the example at issue), overall throughput is significantly reduced with respect to a traditional CRAN architecture wherein time-domain transmission over the fronthaul link takes place.

According to the present invention, additionally (as herein assumed by way of example) or alternatively to frequency-domain transmission over the fronthaul link, the quantization bit number for (i.e., to be used for quantization by) each quantization module 220 of each remote unit $RU_j$ (hereinafter, quantization bits number $Q_j$) is controlled by a quantization control module 260.

The quantization control module 260, preferably located in the central unit CU, is configured to receive control information coming from each channel decoding module 250 "associated with" a respective remote unit $RU_j$ (or network information $I_{Aj}$) and/or from NAS/RRC/RLC/MAC layers (or network information $I_B$), and to provide, according to such network information (and to corresponding criteria, as discussed herebelow), the quantization bits number $Q_j$ to the quantization modules 225 of the respective remote units $RU_j$—as should be understood, alternatively, the quantization control module 260 might be configured to provide an indication of the quantization bits number $Q_j$, in which case the quantization bits number $Q_j$ might instead be calculated elsewhere (e.g. directly within the quantization module 225 of each remote unit $RU_j$).

Network information $I_{A1}$-$I_{A3}$ may comprise, for example, an indication (e.g. provided by one or more parameters measured at central unit CU side) of data traffic (and, preferably, of spatial distribution thereof) that the remote units $RU_j$ have to transmit to the associated central unit CU, whereas network information $I_B$ may comprise, for example, an indication of user profile and/or service type (and the associated "Quality of Service" (QoS) classes defined by the "QoS Class Identifier" (QCI)) coming from the NAS layer.

In the advantageous scenario herein considered wherein the signals from various user equipment $UE_i$ belonging/pertaining to a given remote unit $RU_j$ are separated (and transmitted) in the frequency-domain, quantization control may be performed on a per-user basis—and, in order achieve that, each remote unit $RU_j$ is preferably provided, at each sub-frame (i.e., every 1 ms), with resource allocation scheduled by a scheduler unit located in the central unit CU (not shown). Thus, although the reference $I_B$ lacks of any indexing for the sake of ease, the information $I_B$ may preferably comprise information relating to different user equipment $UE_i$ of the different remote units $RU_j$.

The present invention thus introduces variable quantization of the signals transmitted on the fronthaul link, in order to exploit different trade-offs between system/user performance and throughput load on the fronthaul link $F_L$. In particular, the quantization bit number $Q_j$ is dynamically changed/updated/adapted according to one or more criteria taking into account, among the others, network load, system and/or users status and/or configurations.

Without losing of generality, some relevant criteria (based on the network information $I_{Aj}, I_B$ of above) will be briefly introduced and discussed in the following, it being understood that the following criteria (or at least a part thereof) may be adopted additionally or alternatively to each other, as well as additionally or alternatively to other suitable criteria, not herein considered for the sake of conciseness, depending on specific design options:

a) Adaptation on Per-remote Unit Basis

According to such a criterion, adaptation of the quantization bit number $Q_j$ is controlled by the central unit CU jointly for all the connected remote units $RU_j$, thus making it possible to balance/distribute the assigned fronthaul (data load) capacity between the different remote units $RU_j$ or to assign more (or less) fronthaul capacity to each remote unit $RU_j$ according to a level of served data traffic. This avoids fronthaul congestion, i.e. an undesired condition occurring when fronthaul capacity is not sufficient to transport the aggregated data traffic delivered over the radio interface by the group of remote units $RU_j$ connected to the central unit CU. In order to avoid such a condition, it would be necessary to design the fronthaul bandwidth by considering the worst case that all the remote units $RU_j$ are providing the maximum theoretical data throughput to the served user equipment $UE_i$. However, considering the very large data throughput that can be provided by the last generation wireless communication networks and that scenarios with very large number of remote units $RU_j$ are possible, it follows that a fronthaul design based on peak condition would be very expensive. Thus, by adapting the quantization bit number $Q_j$ according to the present invention, preferably together with a fronthaul capacity featuring a predefined probability of congestion below the peak condition, the effect of the fronthaul congestion is strongly limited.

b) Semi-static Adaptation on a Per-User Basis

According to such a criterion, adaptation of the quantization bit number $Q_j$ is carried out according to user profile (and, hence, according to network information $I_B$). For example, a larger quantization bit number $Q_j$ could be used for high-class users (e.g., gold users) whereas a smaller quantization bits number $Q_j$ could be used for low-class users (e.g., silver/bronze users). Additionally or alternatively, adaptation of the quantization bit number $Q_j$ is carried out according to type of service (and, hence, still according to the network information $I_B$) the users are making use of. For example, background services that are delay tolerant (e.g., mail delivery) may be associated with a smaller quantization bit number $Q_j$, whereas real-time services (e.g., video/audio calls) may be associated with a larger quantization bits number $Q_j$.

c) Dynamic Adaptation on a Per User Basis

The quantization bit number $Q_j$ for the different remote units $RU_j$ can be dynamically selected in a joint manner in order to balance the fronthaul load generated by the different remote units $RU_j$ or to dynamically exploit the spatial distribution of the data traffic. For example, the small fronthaul load generated by a j-th remote unit $RU_j$ that is serving few users equipment $UE_i$ may be exploited in order to increase the quantization bits number $Q_j$ of another remote unit $RU_j$ that is serving a busy hot-spot traffic. In this case the quantization bit number $Q_j$ assigned to a given user signal may be related to specific parameters, measured by the central unit CU, providing an indication of the spatial distribution of data traffic. Preferably, although not necessarily, such parameters may comprise one or more between:

Average number of "Hybrid Automatic Repeat Request" (H-ARQ) transmissions;

Average number of "Radio Link Control" retransmissions;

"Block Error Rate" after the first H-ARQ transmission (e.g., averaged over a suitable time window); and Measured "Signal to Interference plus Noise Ratio" (SINR)—for example, the quantization bits number $Q_j$ may be reduced for users that are in very good channel condition (i.e., users equipment $UE_i$ close to the remote units $RU_j$ that are experiencing high SINR).

Thanks to the present invention, a more efficient use of transmission resources between the central unit CU and the remote units $RU_j$ is carried out, which allows increasing the maximum number of remote units $RU_j$ that can be connected by a given optical fiber link $F_L$ or through other fronthaul link technologies (e.g. microwave or millimeter waves).

As should be readily understood, the physical layer functionalities may be partitioned between central unit CU and the remote units $RU_j$ in other ways without affecting the principles of the present invention.

Figure 2B:
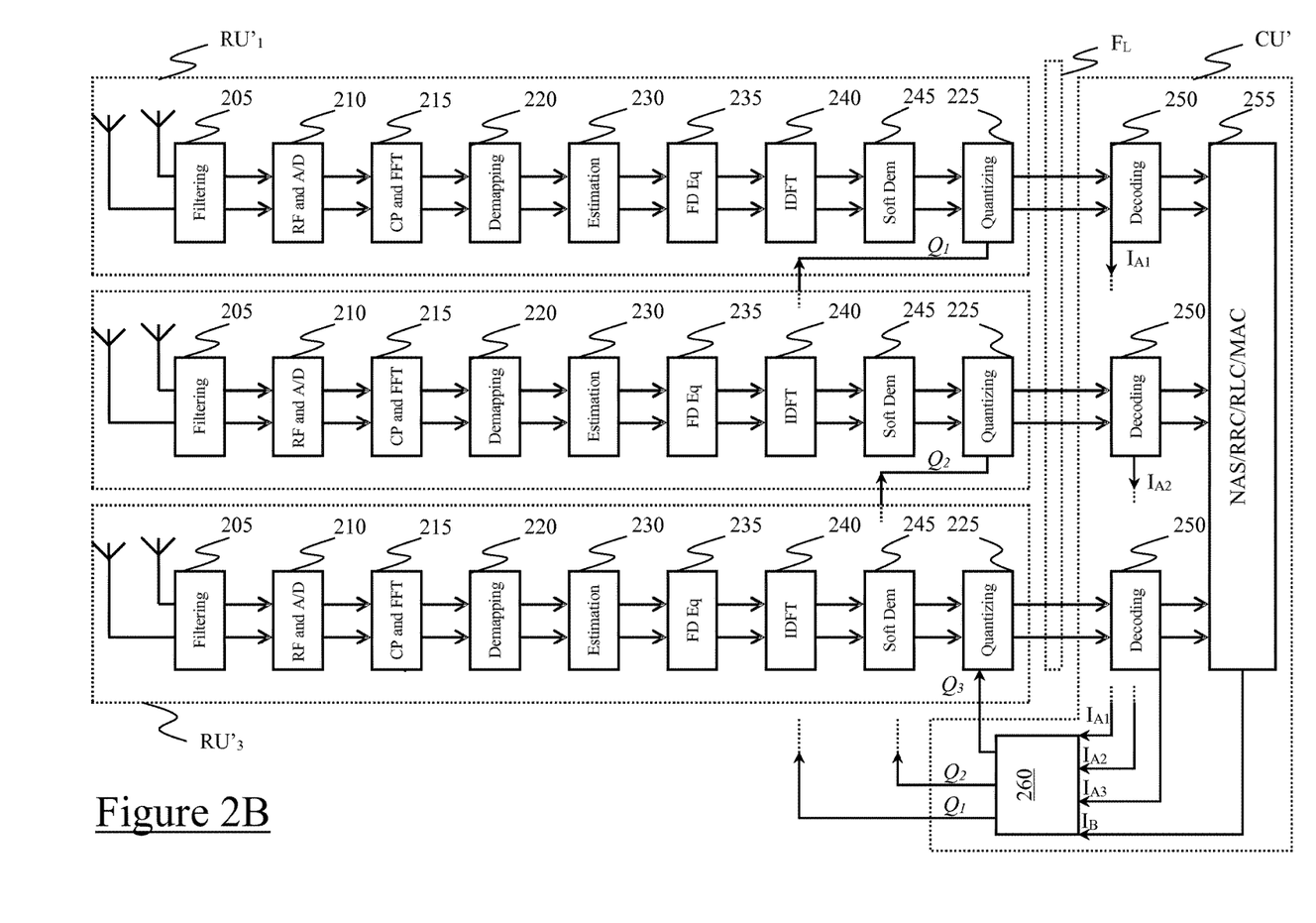

In this respect, FIG. 2B schematically shows some relevant modules of central CU' and remote RU'$_j$ (e.g., RU'$_1$-RU'$_3$) units according to a second embodiment of the present invention. In this embodiment, filtering (module 205), radio-frequency processing and analog-to-digital conversion (module 210), "Cyclic Prefix" (CP) removal and "Fast Fourier Transformation" (FFT) (module 215), resource element demapping (module 220), channel estimation (module 230), frequency-domain equalization (module 235), "Inverse Discrete Fourier Transformation" (IDFT) precoding (module 240), soft-demodulation (i.e., symbol-to-bit demapping) (module 245) and quantization (module 225) are performed (preferably in this order) in each remote unit RU'$_j$, whereas channel decoding (module 250) and higher layer protocols functionalities such as "Non Access Stratum" (NAS), "Radio Resource Control" (RRC), "Radio Link Control" (RLC) and "Medium Access Control" (MAC) layers (module 255) are still performed in the central unit CU'.

Thus, with respect to the previous embodiment, LLR ("Log Likelihood Ratio")-based bit estimates, or soft bits, from the soft-demodulation module 245 are transmitted over the fronthaul link, after quantization (quantization module 225) by a proper quantization bits number $Q_j$ depending on information $I_{Aj}, I_B$, it being understood that all the above considerations about the quantization bits number $Q_j$ and the information $I_{Ap}I_B$ also apply to this embodiment.

The proposed CRAN architectures provides significant advantages in terms of throughput reduction of the signals transmitted over the fronthaul link with respect to state of the art solutions, as the following numerical examples show comparatively for conventional time-domain transmission, frequency-domain transmission and frequency domain transmission with control of the quantization bit number according to the present invention.

As far as the time-domain transmission is concerned, an estimate of the fronthaul capacity for the transmission of one LTE carrier over the optical fiber link may be obtained considering the characteristics of the SC-FDMA signal. The signal at the input of the FFT module is sampled with a frequency of 30.72 MHz in case of a 20 MHz LTE cell. The signal is typically oversampled by a factor two, so that the sampling frequency $f_s$ of the signal transmitted over the optical fiber link is 61.44 Mbit/s. Besides, two signals must be transmitted when considering a MIMO 1×2 antenna configuration (i.e., with K=2 antennas at a remote unit side and one antenna at a user equipment side). Finally, assuming that a number P of components of the SC-FDMA signal (typically, in case of the In-phase and Quadrature components, P=2) are provided, and that quantization thereof is typically performed by using a fixed number of quantization bits Q (typically Q=10, so that performance degradation in terms of Block Error Rate or Throughput caused by quantization is negligible with respect non-quantized signals), throughput over the optical fiber link generated by one 20 MHz LTE cell may be estimated as follows:

$$K*f_s*P*Q$$

which is equal to 2.46 Gbit/s in the example at issue. Such estimate, which does not intentionally consider neither the overhead introduced by the usage of line codes for the protection of the information nor the overhead generated by possible control signaling, shows that the fronthaul link may become a potential bottleneck when considering either a scenario with a large number of remote units connected to the central unit, or a MIMO configuration with a large number of antennas, or also a multi-RAT ("Radio Access Technology") scenario.

As far as the frequency-domain transmission is concerned according to the physical layer splitting of FIG. 2A, an estimate of throughput over the fronthaul link may be calculated as follows:

$$P*N_{sub}*K*Q*1/T_s$$

wherein
  Q is the quantization bit number,
  $T_s$ is the OFDM symbol duration (66.6 ms for the LTE system),
  $N_{sub}$ is the number of modulated OFDM sub-carriers Considering the case of a 20 MHz LTE carrier ($N_{sub}$=1200), Release 10 MIMO transmission (i.e. double codeword transmission, with K=2), and Q=10 the throughput is equal to 720 Mbit/s. The reduction of the fronthaul load compared with the conventional time-domain transmission comes from the fact that some ancillary information that represents just an overhead (e.g. cyclic prefix, null sub-carrier at the band edge) does not need to be transmitted over the fronthaul link.

As far as the frequency-domain transmission according to the physical layer splitting of FIG. 2B with quantization bit number $Q_j$ control is concerned, an estimate of throughput over the fronthaul link may be calculated as follows:

$$N_{sub}*N_{bit}*K*Q_j*1/T_s$$

wherein
  $Q_j$ is the quantization bi number (adapted according to the present invention),
  $T_s$ is the OFDM symbol duration (66.6 ms for the LTE system),
  $N_{sub}$ is the number of modulated OFDM sub-carriers, and
  $N_{bit}$ is the number of bits carried by each OFDM sub-carrier.

Considering the case of a 20 MHz LTE carrier ($N_{sub}$=1200), Release 10 MIMO transmission (i.e. double codeword transmission, with K=2), 64-QAM modulation ($N_{bit}$=6), and a typical value of $Q_j$=3 (as the Applicant has experimentally found that, thanks to the present invention, the quantization bits number $Q_j$ typically ranges between 1 and 5 bits), the throughput is equal to 648 Mbit/s (which is lower than frequency-domain transmission without quantization control, and corresponds to a compression factor of more than 3 times compared to the conventional time-domain transmission of the SC-FDMA signal).

It must be pointed out that the system concept and the adaptation mechanisms discussed before for the uplink (i.e., wherein the remote units act as the transmitting side and the central unit acts as receiving side) may be also applied for the downlink (i.e., wherein the central unit acts as the transmitting side and the remote units act as the receiving side). In the downlink case the IDFT module can be arranged in the remote units and the quantized signals transmitted by the central unit to the remote units in the frequency-domain. In the downlink case the adaptation procedure on a per remote unit-basis or the semi-static adaptation on a per user basis may exploit the same metrics (e.g. remote unit load, user class, service type, and the like) defined for the uplink. Conversely, in case of dynamic adaptation mechanisms on a per user basis, the radio quality metrics to be used for the adaptation process could be the channel quality metrics reported by the user equipment, such as the "Channel Quality Indicator" (CQI) or the acknowledgment bits (ACK/NACK) for the H-ARQ transmissions. Preferably, the quantization bit number is determined at the central unit side and communicated to the remote units in both uplink and downlink cases, for different reasons. Indeed, in the uplink case, as discussed above, the quantization bit number is used by the remote units for performing the quantization, whereas in the downlink case the remote units are preferably informed about the quantization bits number (used for quantization at the central unit side) for further signal processing.

Naturally, in order to satisfy local and specific requirements, a person skilled in the art may apply to the solution described above many logical and/or physical modifications and alterations. More specifically, although the present invention has been described with a certain degree of particularity with reference to preferred embodiments thereof, it should be understood that various omissions, substitutions and changes in the form and details as well as other embodiments are possible. In particular, different embodiments of the invention may even be practiced without the specific details set forth in the preceding description for providing a more thorough understanding thereof; on the contrary, well-known features may have been omitted or simplified in order not to encumber the description with unnecessary details. Moreover, it is expressly intended that specific elements and/or method steps described in connection with any disclosed embodiment of the invention may be incorporated in any other embodiment as a matter of general design choice.

More specifically, the solution according to an embodiment of the invention lends itself to be implemented through an equivalent method (by using similar steps, removing some steps being not essential, or adding further optional steps); moreover, the steps may be performed in different order, concurrently or in an interleaved way (at least partly).

Although in the present description explicit reference to pilot symbols as well as primary and secondary synchronization symbols has been made, this should not be construed limitatively. Indeed, other control signals or channels having characteristic of persistence may be generated locally in the remote units.

In addition, analogous considerations apply if the mobile network has a different structure or comprises equivalent components, or it has other operating features. In any case, any component thereof may be separated into several elements, or two or more components may be combined into a single element; in addition, each component may be replicated for supporting the execution of the corresponding operations in parallel. It should also be noted that any interaction between different components generally does not need to be continuous (unless otherwise indicated), and it may be both direct and indirect through one or more intermediaries.

Moreover, although explicit reference has been made to mobile network based on the LTE standard, it should be understood that it is not in the intentions of the Applicant to be limited to the implementation of any particular mobile network architecture or protocol.

Moreover, although in the present description explicit reference to optical fiber links has been made, this should not be construed limitatively. Indeed, the principles of the present invention may be also applied to scenarios wherein fronthaul link is managed by means of wireless links instead of the optical fiber link.

Finally, the method could be easily applied also to a system different than OFDMA based ones. By way of example only, in case of systems based on a CDMA ("Code Division Multiple Access") technique, such as the 3GPP UMTS/HSDPA system, the principles of the present invention described above may be applied with simple modifications. For example, a skilled person, in the light of the teachings of the present invention, may operate so as to execute spreading and scrambling operations in the remote units, thereby making it possible to transmit the different user signals in the fronthaul link as separate signals. This would allow transmitting only the signals of the users that are actually allocated for transmission, with the clear advantage that the transmission rate on the fronthaul link would become proportional to the actual load on the radio interface. In turn, this would allow performing statistical multiplexing/load balancing among the remote units connected to the same fronthaul network.

The invention claimed is:

1. A method of arranging, in a mobile communication network, transmission of data between user equipment and at least one base station comprising a central unit and at least one remote unit associated therewith, the method comprising:
at a transmitting side comprising the remote unit or the central unit,
quantizing the data according to a quantization bit number, and
transmitting, over a fronthaul link between the transmitting side and a receiving side comprising the central unit or the remote unit, respectively, the quantized data to the receiving side,
at the central unit:
determining the quantization bit number, wherein the determining comprises varying in time the quantization bit number according to network information available at the central unit, and wherein the network information comprises one or more of user profile information or service type information; and
communicating to the at least one remote unit the determined quantization bit number.

2. The method of claim 1, wherein the network information comprises data traffic that the transmitting side has to transmit to the receiving side, and wherein the quantization bit number is determined so as to distribute a data load capacity of the fronthaul link between each one of the at least one remote unit according to the data traffic.

3. The method of claim 1, wherein the network information comprises an indication of a spatial distribution of data traffic that the transmitting side has to transmit to the receiving side, the method further comprising determining the spatial distribution of the data traffic according to at least one parameter measured at the central unit.

4. The method of claim 3, wherein the parameter comprises one or more of:
average number of Hybrid Automatic Repeat Request transmissions;
average number of Radio Link Control transmissions;
average Block Error Rate after a first Hybrid Automatic Repeat Request transmission; or
Signal to interference plus Noise Ratio.

5. The method of claim 1, wherein the transmitting the quantized data to the receiving side comprises transmitting the quantized data in a frequency-domain.

6. The method of claim 1, wherein the transmitting side comprises the at least one remote unit and the receiving side comprises the central unit.

7. A system for exchanging data with user equipment in a mobile communication network, the system comprising a central unit adapted to be associated with at least one remote unit, the central unit being configured to:
determine a quantization bit number according to network information available at the central unit, wherein the network information comprises one or more of user profile information or service type information, and
communicate the determined quantization bit number to the at least one remote unit in order to allow the at least one remote unit to quantize the data according to the quantization bit number and to transmit, over a fronthaul link between the central unit and the at least one remote unit, the quantized data to the central unit.

8. The system of claim 7, further comprising the at least one remote unit.

9. The system of claim 8, wherein the at least one remote unit is connected to the central unit by one or more optical fiber links.

10. The system of claim 8, wherein the at least one remote unit is connected to the central unit by one or more wireless communication links.

11. The system of claim 8, wherein the network information comprises data traffic that the at least one remote unit has to transmit to the associated central unit, and wherein the quantization bit number is determined so as to distribute a data load capacity of the fronthaul link between each one of the at least one remote unit according to the data traffic.

12. The system according of claim 8, wherein the network information comprises an indication of a spatial distribution of data traffic that the at least one remote unit has to transmit to the associated central unit, the central unit being further configured to determine the spatial distribution of the data traffic according to at least one parameter measured at the central unit among:
- average number of Hybrid Automatic Repeat Request transmissions;
- average number of Radio Link Control transmissions;
- average Block Error Rate after a first Hybrid Automatic Repeat Request transmission; and
- Signal to interference plus Noise Ratio.

13. A non-transitory computer readable medium including software code portions stored therein that, when executed by at least one computer, cause the following to be performed:
- at a transmitting side comprising a remote unit or a central unit,
  - quantizing data according to a quantization bit number, and
  - transmitting, over a fronthaul link between the transmitting side and a receiving side comprising the central unit or the remote unit, respectively, the quantized data to the receiving side
- at the central unit:
  - determining the quantization bit number, wherein the determining comprises varying in time the quantization bit number according to network information available at the central unit, and wherein the network information comprises one or more of user profile information or service type information; and
  - communicating to the remote unit the determined quantization bit number.

14. The non-transitory computer readable medium of claim 13, wherein the network information comprises data traffic that the transmitting side has to transmit to the receiving side, and wherein the quantization bit number is determined so as to distribute a data load capacity of the fronthaul link between each one of at least one remote unit according to the data traffic.

15. The non-transitory computer readable medium of claim 13, wherein the network information comprises an indication of a spatial distribution of data traffic that the transmitting side has to transmit to the receiving side, and wherein the non-transitory computer readable medium includes software code portions stored therein that, when executed by the at least one computer, cause the following to be performed:
- determining the spatial distribution of the data traffic according to at least one parameter measured at the central unit.

16. The non-transitory computer readable medium of claim 15, wherein the parameter comprises one or more of:
- average number of Hybrid Automatic Repeat Request transmissions;
- average number of Radio Link Control transmissions;
- average Block Error Rate after a first Hybrid Automatic Repeat Request transmission; or
- Signal to interference plus Noise Ratio.

17. The non-transitory computer readable medium of claim 13, wherein the transmitting the quantized data to the receiving side comprises transmitting the quantized data in a frequency-domain.

18. The non-transitory computer readable medium of claim 13, wherein the transmitting side comprises the remote unit and the receiving side comprises the central unit.

* * * * *